United States Patent
Hsu (10) Patent No.: US 11,245,209 B2
(45) Date of Patent: Feb. 8, 2022

(54) ELECTRICAL CONNECTOR BETWEEN CPU AND PCB

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventor: Shuo-Hsiu Hsu, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 17/027,616

(22) Filed: Sep. 21, 2020

(65) Prior Publication Data

US 2021/0091490 A1 Mar. 25, 2021

(30) Foreign Application Priority Data

Sep. 20, 2019 (CN) .......................... 201910893533.X (51) Int. Cl.
*H01R 12/70* (2011.01)
*H01R 12/71* (2011.01)
(Continued)

(52) U.S. Cl.
CPC ....... *H01R 12/7076* (2013.01); *H01R 12/714* (2013.01); *H01R 13/2435* (2013.01);
(Continued)

(58) Field of Classification Search
CPC .............. H01R 12/7076; H01R 12/714; H01R 13/2485
See application file for complete search history.

(56) References Cited

U.S. PATENT DOCUMENTS 5,215,472 A * 6/1993 DelPrete .............. G01R 1/0483
439/331
5,800,184 A * 9/1998 Lopergolo ........... H05K 7/1069
439/591
(Continued)

FOREIGN PATENT DOCUMENTS

CN 107134704 A 9/2017

*Primary Examiner* — Neil Abrams
(74) *Attorney, Agent, or Firm* — Ming Chieh Chang; Wei Te Chung (57) ABSTRACT

An electrical connector for connection between the CPU and the PCB includes an insulative housing, an insulative plate below the housing and a plurality of contacts retained to the housing and the plate. The housing forms a receiving cavity for receiving the CPU, and the plate forms a mounting face confronting the PCB. Each contact includes an upper part and a lower part discrete and independent from each other. The upper part includes an upward resilient arm extending into the receiving cavity for mechanically and electrically connecting to the CPU, and a bottom connecting section. The lower part includes a downward resilient arm extending toward the PCB for mechanically and electrically connecting to the PCB, and a top connecting section. The bottom connecting section and the top connecting section are mechanically and electrically connected to each other.

20 Claims, 7 Drawing Sheets

(51) Int. Cl.
*H01R 13/24* (2006.01)
*H05K 7/10* (2006.01)
*H01R 13/405* (2006.01)
*H01R 43/20* (2006.01)

(52) U.S. Cl.
CPC ..... *H01R 13/2485* (2013.01); *H01R 13/2492* (2013.01); *H01R 13/405* (2013.01); *H01R 43/20* (2013.01); *H05K 7/1061* (2013.01)

(56) References Cited

U.S. PATENT DOCUMENTS

| | | | |
|---|---|---|---|
| 6,186,797 B1* | 2/2001 | Wang | H01R 13/2435 439/66 |
| 7,878,817 B2* | 2/2011 | Lin | H01R 13/2435 439/66 |
| 7,946,855 B2* | 5/2011 | Osato | H01R 13/2421 439/66 |
| 8,851,904 B2* | 10/2014 | Chang | H05K 7/10 439/71 |
| 9,362,687 B1* | 6/2016 | Ju | H01R 13/035 |
| 10,256,588 B2* | 4/2019 | Oda | G01R 1/067 |
| 10,326,225 B2 | 6/2019 | Lotes | |
| 10,615,527 B2* | 4/2020 | Ou | H01R 12/7082 |
| 10,651,584 B2* | 5/2020 | Hsu | H01R 13/428 |
| 10,680,374 B2* | 6/2020 | Hsu | H01R 12/707 |
| 10,797,424 B2* | 10/2020 | Hsu | H01R 12/7082 |
| 2021/0091490 A1* | 3/2021 | Hsu | H05K 7/1061 |

\* cited by examiner

ELECTRICAL CONNECTOR BETWEEN CPU AND PCB

BACKGROUND OF THE INVENTION

1. Field of the Invention

The present invention relates generally to an electrical connector, and particularly to the electrical connector having a plurality of contacts each of which is essentially composed of an upper part and a lower part with a solder ball integrally formed therebetween.

2. Description of Related Arts

U.S. Pat. No. 10,326,225 discloses an electrical connector having the contacts with opposite resilient contact arms for connecting opposite CPU and PCB. Anyhow, because the contact is preformed and vertically assembled within the corresponding passageway of the insulative housing of the connector and the resilient arm extends with a relative long distance in a top view, it inevitably results in a relatively large passageway which may jeopardize the strength of the housing, disregarding whether the contact is assembled into the housing either upwardly or downwardly. In addition, the relatively large passageways may preclude the fine pitch of the contact arrangement in the housing. Understandably, the traditional connector using the solder ball for connection between the PCB and the contact may allow the relatively small passageway in the housing. It is because the contact may be downwardly assembled into the corresponding passageway, and the lower portion without the resilient arm of the contact is dimensioned relatively small. Therefore, the significant problem of the contact having opposite resilient arms in the vertical direction as disclosed in the aforementioned patent includes both the strength issue and the preclusion of fine pitch arrangement issue.

Hence, it is desired to have an electrical connector for connection between the CPU and the PCB characterized with the fine pitch and the preferable strength as the traditional connector which uses the solder balls connecting the PCB.

SUMMARY OF THE INVENTION

To achieve the above object, an electrical connector for connection between the CPU and the PCB includes an insulative housing, an insulative plate below the housing and a plurality of contacts retained to the housing and the plate. The housing forms a receiving cavity for receiving the CPU, and the plate forms a mounting face confronting the PCB. Each contact includes an upper part and a lower part discrete and independent from each other. The upper part includes an upward resilient arm extending into the receiving cavity for mechanically and electrically connecting to the CPU, and a bottom connecting section. The lower part includes a downward resilient arm extending toward the PCB for mechanically and electrically connecting to the PCB, and a top connecting section. The bottom connecting section and the top connecting section are mechanically and electrically connected to each other wherein the connection between the bottom connecting section are secured with each other preferably via a solder ball, and the upward resilient arm and the downward resilient arm are preferably symmetrically arranged with each other in the vertical direction.

Other advantages and novel features of the invention will become more apparent from the following detailed description of the present embodiment when taken in conjunction with the accompanying drawings.

DETAILED DESCRIPTION OF THE PREFERRED EMBODIMENT

Figure 1:
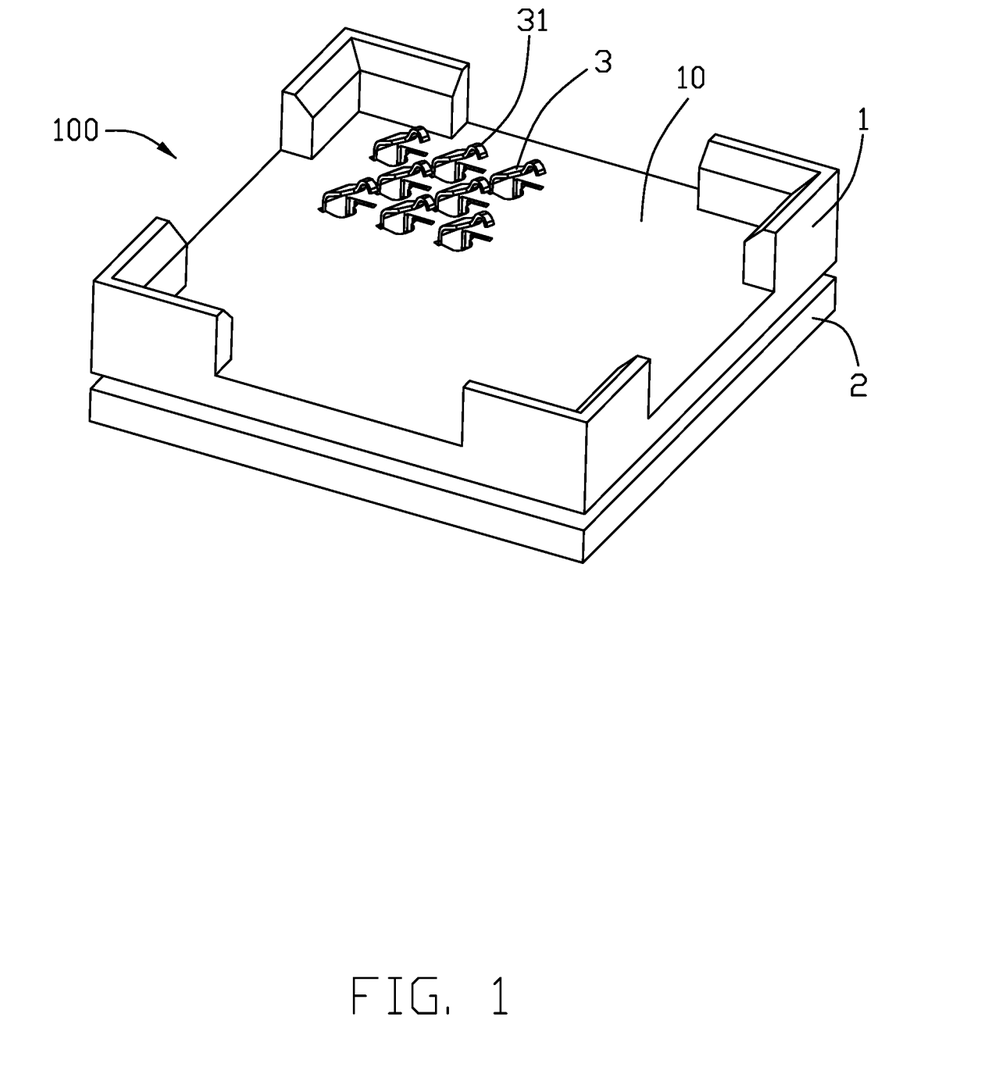
FIG. 1 is a perspective view of the electrical connector of the present invention.
Figure 2:
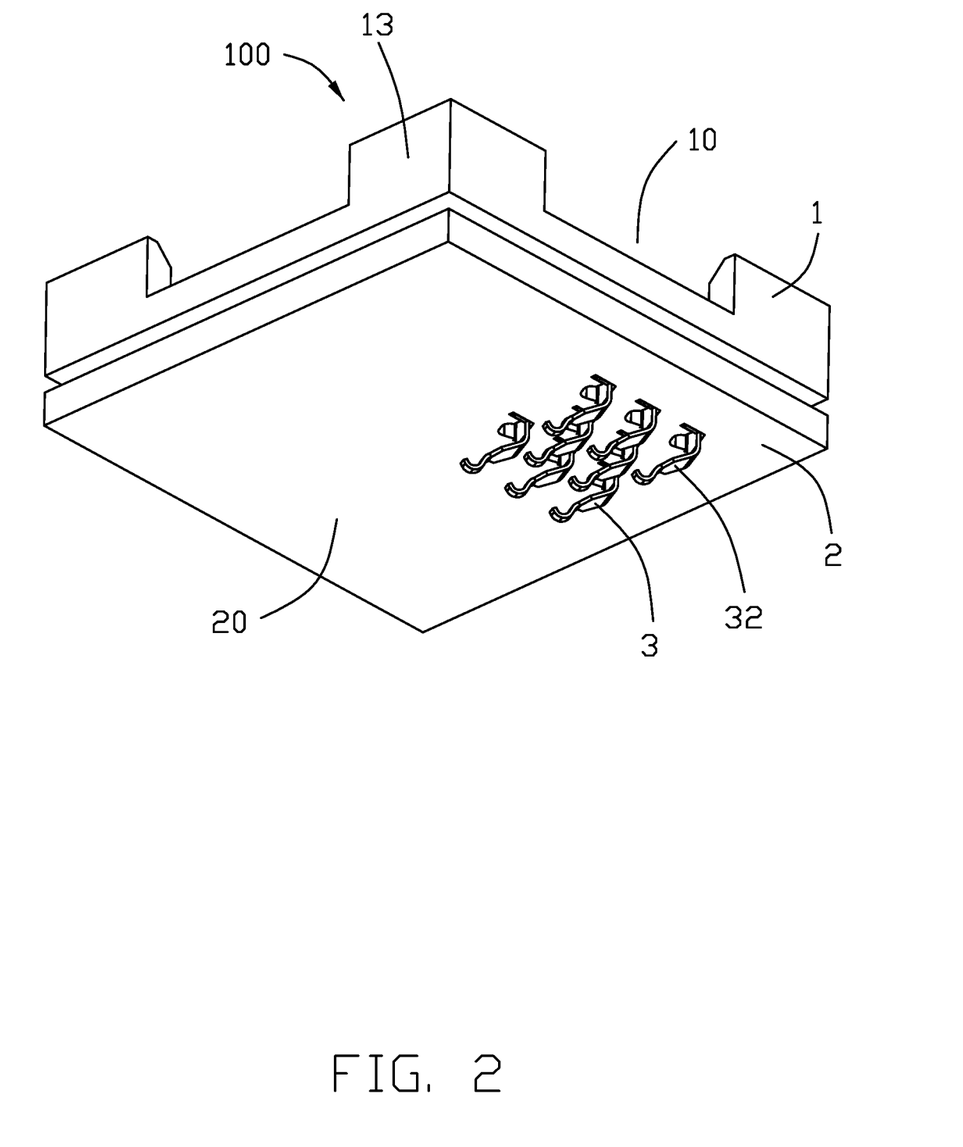
FIG. 2 is another perspective view of the electrical connector of FIG. 1.
Figure 3:
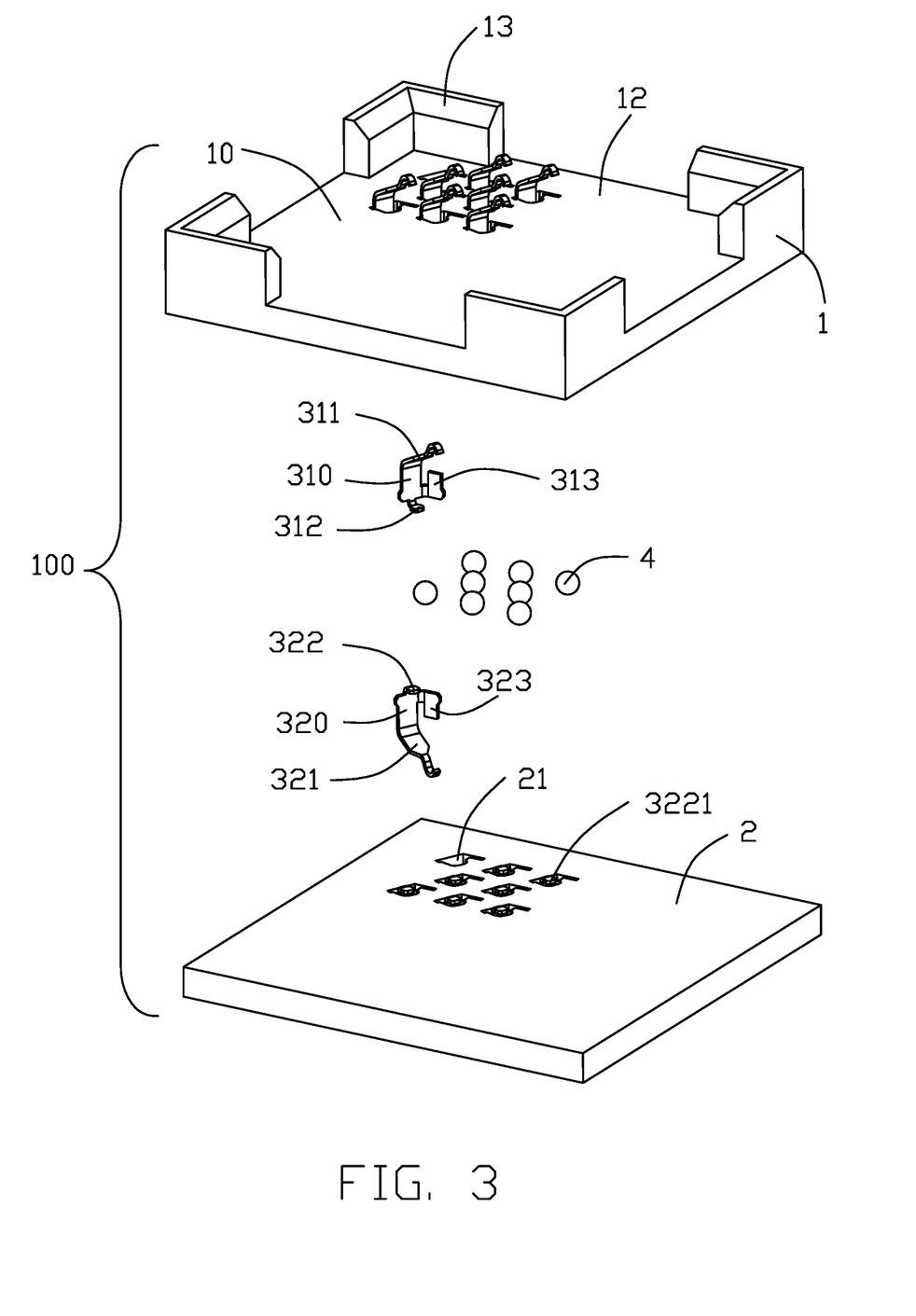
FIG. 3 is an exploded perspective view of the electrical connector of FIG. 1.
Figure 4:
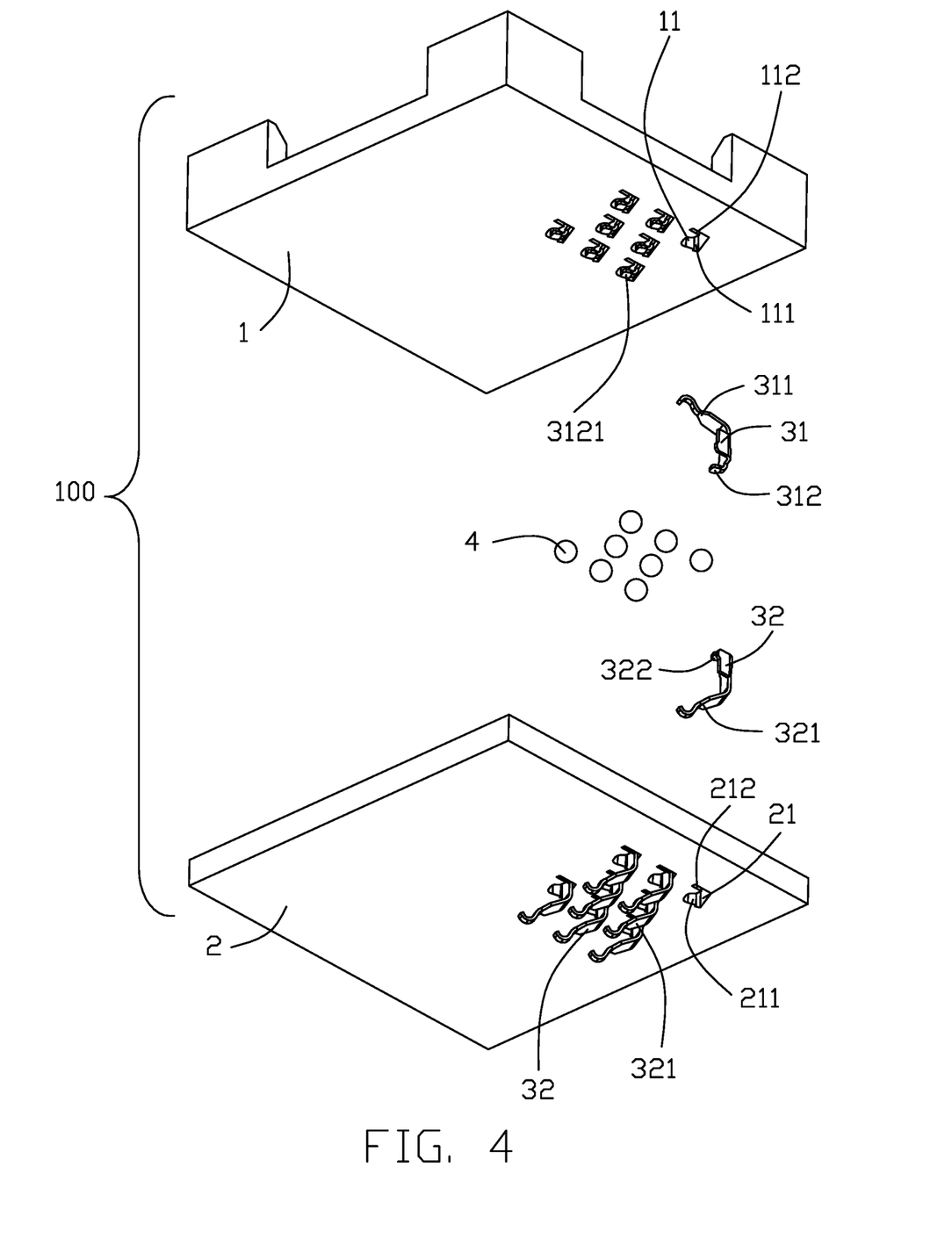
FIG. 4 is an exploded perspective view of the electrical connector of FIG. 2.
Figure 5:
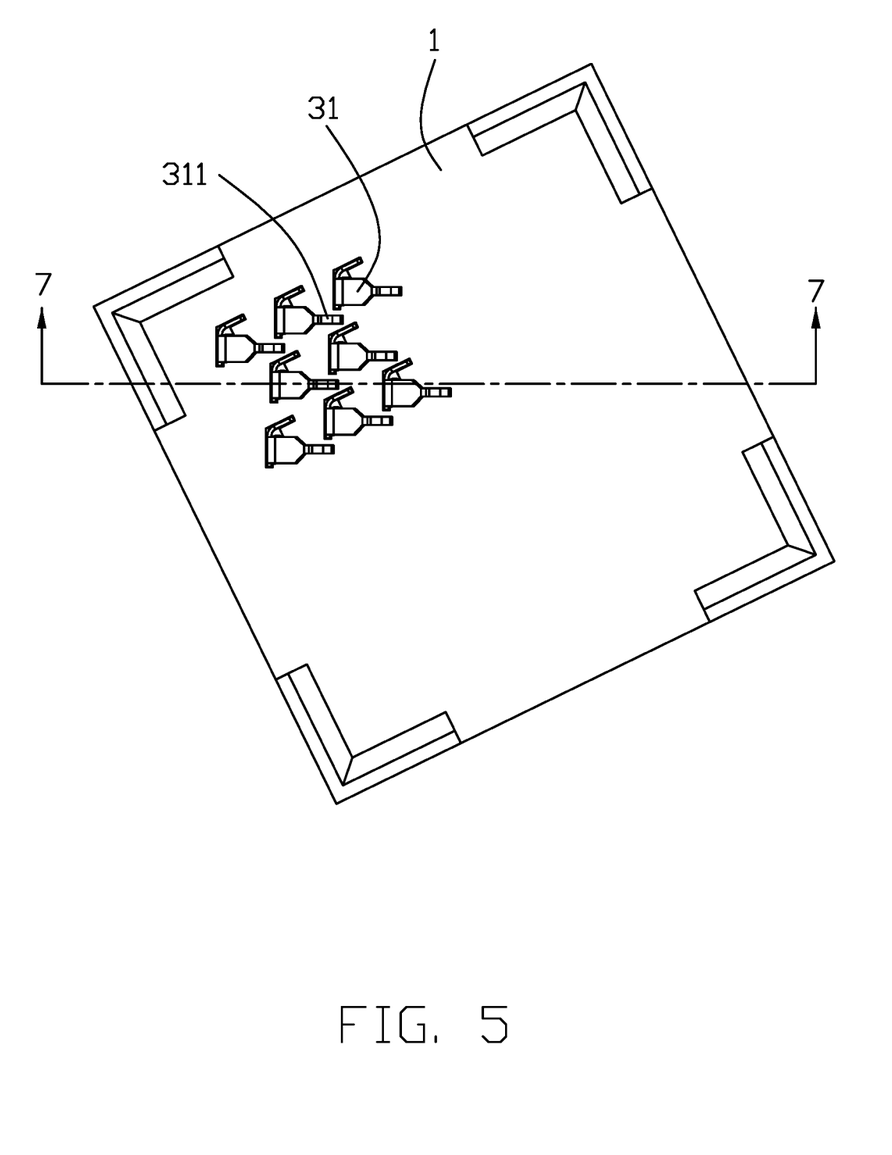
FIG. 5 is a top view of the electrical connector of FIG. 1.
Figure 6:
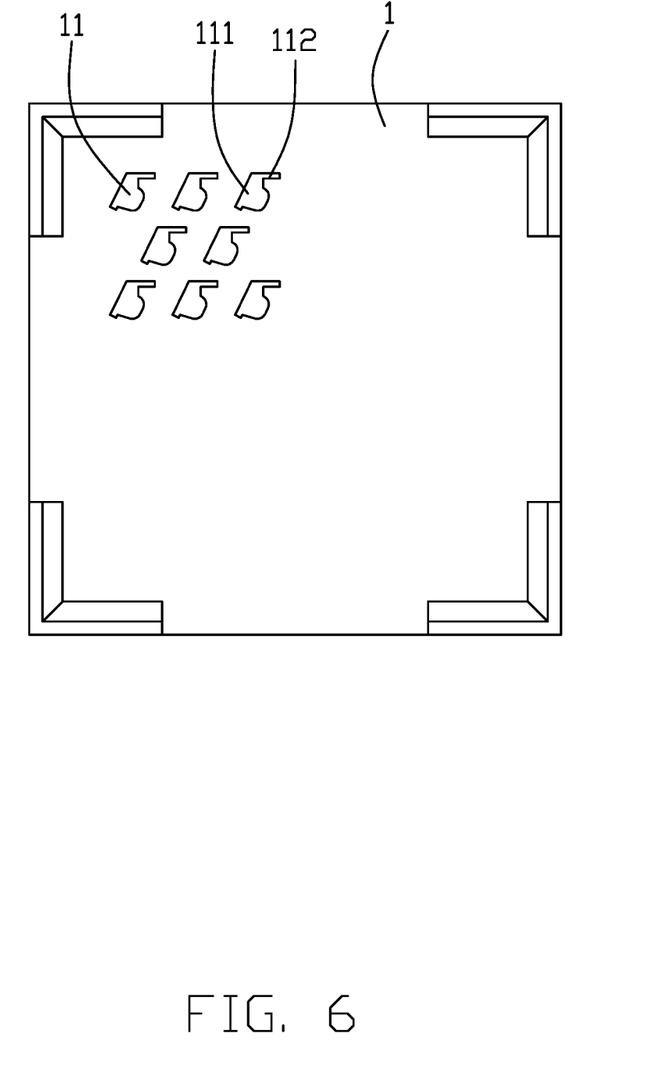
FIG. 6 is a top view of the electrical connector of FIG. 1 without the contacts.
Figure 7:
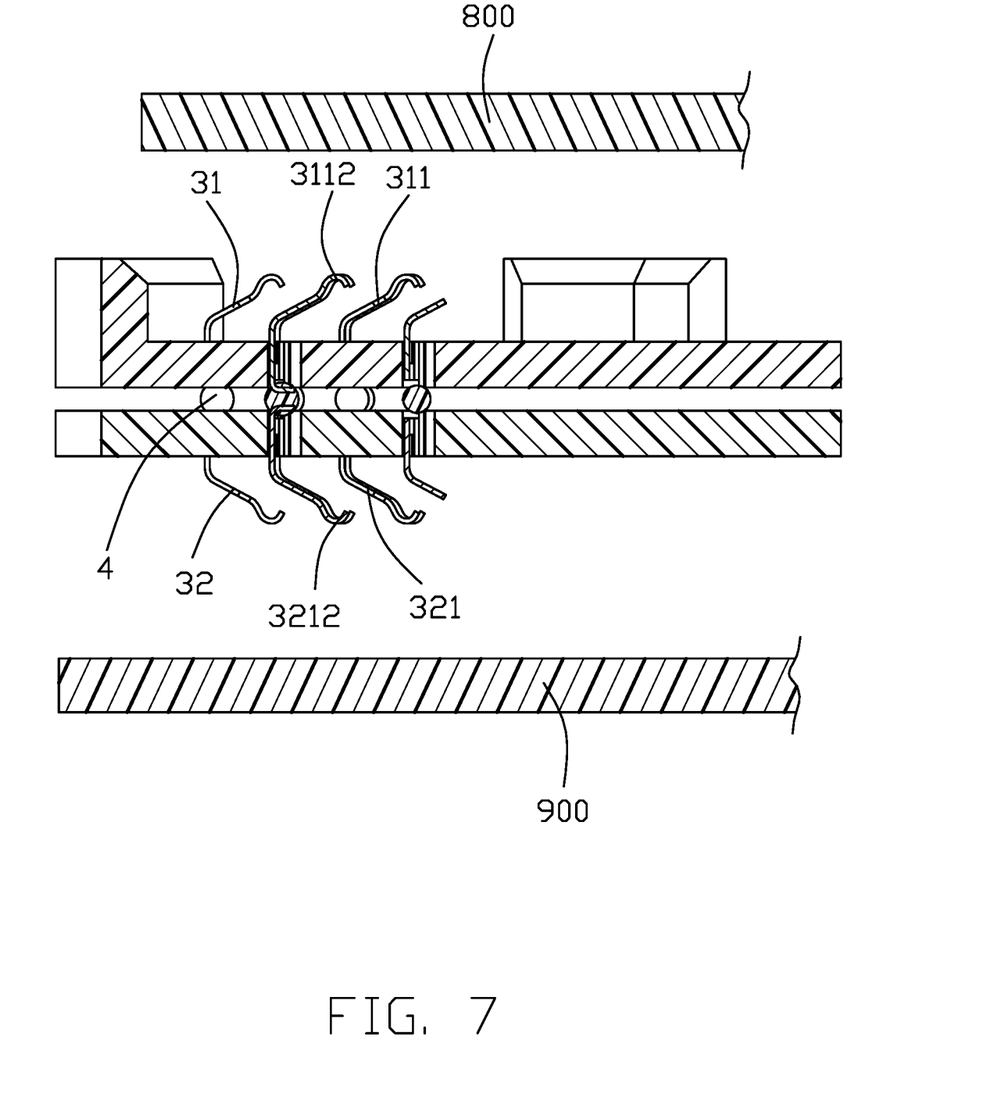
FIG. 7 is a cross-sectional view of the electrical connector of FIG. 4.

Referring to FIGS. 1-7, an electrical connector 100 for connecting a CPU or an electronic package or a first electronic part 800 to a PCB or second electronic part 900, includes an insulative housing 1, an insulative plate 2 below the housing 1, and a plurality of contacts 3 retained to both the housing 1 and the plate 2. The housing 1 forms an upper/upward surface 12 with four upward extending towers 13 at four corners to commonly form a receiving cavity 10 for receiving the CPU 800 therein. The plate 2 forms a mounting/downward/lower surface 20 for mounting upon the PCB 900. The contact 3 includes an upper/first part 31, and a lower/second part 32 discrete and independent from each other. The upper part 31 includes an upper/upward/first resilient arm 311 and a bottom/downward/first connecting section 312, and the lower part 32 includes a lower/downward/second resilient arm 321 and a top/upward/second connecting section 322. The bottom connecting section 312 and the top connecting section 322 are secured to each other via a solder ball 4 so as to complete the whole contact 3.

The housing 1 forms a plurality of first passageways 11 in matrix. Each first passageway 11 extends through the housing 1 in the vertical direction. The upper part 31 includes a first main body 310 and a first retaining section 313 beside the first main body 310 with an angle therebetween in a top view. The upper resilient arm 311 extends upwardly from a top end of the first main body 310, and the bottom connecting section 312 extends from a bottom end of the first main body 310. The upper part 31 is downwardly assembled into the corresponding passageway 11 to have the first retaining section 313 retained thereto. Because the upper resilient arm 311 is outside of the corresponding first passageway 11, it is allowed to minimize the dimension of the first passageway 11 for the fine pitch arrangement of upper part 31 and increasing the housing strength.

Similar to the arrangement between the housing 1 and the upper part 31, the plate 2 forms a plurality of second passageways 21 in matrix. Each second passageway 21 extends through the plate 2 in the vertical direction. Each lower part 32 includes a second main boy 320 and a second retaining section 323 beside the second main body 320 with an angle therebetween in the top view. The lower resilient arm 321 extends downwardly from a bottom end of the second main body 320, and the top connecting section 322 extends from a top end of the second main body 320. The lower part 32 is upwardly assembled into the corresponding second passageway 21 to have the second retaining section 323 retained thereto. Because the lower resilient arm 321 is located outside of the plate 2, it is allowed to minimize the dimension of the second passage 21 for the fine pitch arrangement of lower part 32 and increasing the plate strength. In the embodiment, the first passageways 11 and the second passageways 21 are aligned with each other, respectively, in the vertical direction, and the upper resilient arm 311 and the lower resilient arm 321 are symmetrically arranged with each other in the vertical direction.

The first passageway 11 includes a first receiving hole 111 for receiving the first main body 310 and the bottom connecting section 312, and a first retaining slot 112 communicatively located beside the first receiving hole 111 for receiving the first retaining section 313. Notably, in a top view, the projection of the upper resilient arm 311 is larger than the dimension of the first passageway 11. Similarly, the second passageway 21 includes a second receiving hole 211 for receiving the second main body 320 and the top connecting section 322, and a second retaining slot 212 communicatively located beside the second receiving hole 211 for receiving the second retaining section 323. Notably, in a bottom view, the projection of the lower resilient arm 321 is larger than the dimension of the second passageway 21. According to the aforementioned structures of the connector 100, the upper resilient arm 311 and the lower resilient arm 321 may be lengthened without necessity of enlargement of the corresponding first and second passageways 11, 21, thus optimizing the connector design.

The first passageways 11 and the second passageway 21 are arranged in a hexagonal format. The upper resilient arm 311 includes a first oblique section 3111, and a first contacting section 3112 extending from the first oblique section 3111. The lower resilient arm 321 includes a second oblique section 3211, and a second contacting section 3212 extending from the second oblique section 3211. Understandably, when mated, the upper resilient arm 311 is downwardly deflected by the CPU 800, and the lower resilient arm 321 is upwardly deflected by the PCB. The bottom connecting section 312 includes a first solder pad 3121, the top connecting section 322 includes a second solder pad 3221 aligned with the first solder pad 3121 and secured to each other via a solder ball/mass 4. Understandably, the mechanical securement between the bottom connecting section 312 and the top connecting section 322 may be implemented by other mechanism, e.g., clamping or interfering. Also, the housing 1 and the plate 2 may be directly secured to each other with mechanism, e.g., a board lock equipped upon the housing 1 and a through hole formed in the plate 2.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector comprising:
an insulative housing for receiving an electronic package;
an insulative plate discrete from and located below the insulative housing in a vertical direction for mounting to a printed circuit board; and
a plurality of conductive contacts retained to both the insulative housing and the insulative plate, each contact including:
an upper part retained to the insulative housing and including a downwardly deflectable upper resilient arm for mating the electronic package, and a bottom connecting section below the upper resilient arm; and
a lower part retained to the insulative plate and including an upwardly deflectable lower resilient arm for mounting to the printed circuit board, and a top connecting section above the lower resilient arm; wherein
the bottom connecting section and the top connecting section are secured to each other.

2. The electrical connector as claimed in claim 1, wherein the bottom connecting section and the top connecting section are soldered with each other via a solder mass.

3. The electrical connector as claimed in claim 1, wherein the upper resilient arm and the lower resilient arm are symmetrically arranged with each other in the vertical direction.

4. The electrical connector as claimed in claim 1, wherein the insulative housing forms a plurality of first passageways each retainably receiving a lower portion of the corresponding upper part, and the insulative plate forms a plurality of second passageways each retainably receiving an upper portion of the corresponding lower part.

5. The electrical connector as claimed in claim 4, wherein the first passageways and the second passageways are aligned with each other in the vertical direction, respectively.

6. The electrical connector as claimed in claim 4, wherein in a top view, a projection of the upper resilient arm is larger than a dimension of the corresponding first passageway along an extension direction of the upper resilient arm, and in bottom view, a projection of the lower resilient arm is larger than a dimension of the corresponding second passageway along an extension direction of the lower resilient arm.

7. The electrical connector as claimed in claim 4, wherein the upper resilient arm is exposed outside of the corresponding first passageway, and the lower resilient arm is exposed outside of the corresponding second passageway.

8. The electrical connector as claimed in claim 7, wherein each upper part includes a first main body and a first retaining section angled with the first main body in a top view, and each lower part includes a second main body and a second retaining section angled with the second main body in a bottom view.

9. The electrical connector as claimed in claim 8, wherein the first retaining section is retained in the corresponding first passageway, and the second retaining section is retained in the corresponding second passageway.

10. The electrical connector as claimed in claim 9, wherein the first retaining section of the upper part is symmetrically arranged with the second retaining section of the lower part in the vertical direction.

11. The electrical connector as claimed in claim 1, wherein the insulative housing is spaced from the insulative plate with a gap therebetween in the vertical direction.

12. The electrical connector as claimed in claim 1, wherein in each contact, the upper part is aligned with the lower part in the vertical direction.

13. An electrical connector assembly comprising:
a first electronic part and a second electronic part located below the first electronic part to commonly to sandwich an electrical connector therebetween in a vertical direction,
the electrical connector equipped with thereof a plurality of conductive contacts each having in the vertical direction an upper part and a lower part discrete from while electrically and mechanically connected with each other, and including:

an insulative housing retaining a plurality of upper parts of the contacts; and an insulative plate discrete from and located below the insulative housing and retaining a plurality of lower parts of the contacts; wherein each upper part includes an upwardly extending and downwardly deflectable upper resilient arm to mechanically and electrically connected to the first electronic part, and each lower part includes a downwardly extending and upwardly deflectable lower resilient arm to mechanically and electrically connected to the second electronic part.

14. The electrical connector assembly as claimed in claim 13, wherein the first electronic part is a CPU (Central Processing Unit), and the second electronic part is a PCB (Printed Circuit Board).

15. The electrical connector as claimed in claim 13, wherein in each contact, the upper part is aligned with the lower part in the vertical direction.

16. The electrical connector assembly as claimed in claim 13, wherein in each contact, the upper part and the lower part are soldered with each other via a solder mass.

17. The electrical connector assembly as claimed in claim 13, wherein in each contact, the upper resilient arm is symmetrically arranged with the lower resilient arm in the vertical direction.

18. The electrical connector assembly as claimed in claim 13, wherein in each contact, the upper resilient arm is fully exposed outside of the insulative housing and the lower resilient arm is fully exposed outside of the insulative plate.

19. The electrical connector assembly as claimed in claim 13, wherein the insulative housing form a plurality of first passageways to retain the upper parts of the corresponding contacts while exposing the corresponding upper resilient arms outside of the insulative housing, and the insulative plate forms a plurality of second passageways to retain the lower parts of the corresponding contacts while exposing the corresponding lower resilient arm outside of the insulative plate.

20. An electrical connector for connecting an upper CPU (Central Processing Unit) to a lower PCB (Printed Circuit Board), comprising:

an insulative housing forming an upper surface with four towers upwardly extending from four corners of the housing to cooperate with the upper surface to commonly form a receiving cavity for receiving the CPU;

an insulative plate discrete from and located below the insulative housing in a vertical direction for mounting to the PCB;

a plurality of conductive contacts retained to both the insulative housing and the insulative plate, each of said contacts including:

an upper part having a downwardly deflectable upper resilient arm upwardly extending above the upper surface and into the receiving cavity for mating with the CPU; and a lower part discrete from while connected with the upper part and having an upwardly deflectable lower resilient lower arm downwardly extending below the insulative plate for mating with the PCB.

* * * * *